United States Patent
Jeon et al.

(10) Patent No.: US 11,676,872 B2
(45) Date of Patent: Jun. 13, 2023

(54) MATERIALS AND METHODS FOR PASSIVATION OF METAL-PLATED THROUGH GLASS VIAS

(71) Applicant: Menlo Microsystems, Inc., Irvine, CA (US)

(72) Inventors: Jaeseok Jeon, Latham, NY (US); Christopher F. Keimel, Niskayuna, NY (US); Chris Nassar, Ballston Spa, NY (US); Andrew Minnick, Queensbury, NY (US)

(73) Assignee: MENLO MICROSYSTEMS, INC., Irvine, CA (US)

( * ) Notice: Subject to any disclaimer, the term of this patent is extended or adjusted under 35 U.S.C. 154(b) by 338 days.

(21) Appl. No.: 16/897,788

(22) Filed: Jun. 10, 2020

(65) Prior Publication Data
US 2021/0391228 A1    Dec. 16, 2021

(51) Int. Cl.
*H01L 23/15* (2006.01)
*C23C 16/40* (2006.01)
(Continued)

(52) U.S. Cl.
CPC .......... *H01L 23/15* (2013.01); *C23C 16/402* (2013.01); *C23C 16/45525* (2013.01); *H01L 23/291* (2013.01)

(58) Field of Classification Search
CPC . H01L 23/15; H01L 23/291; H01L 23/49822; H01L 23/49827; H01L 28/75;
(Continued)

(56) References Cited

U.S. PATENT DOCUMENTS

2014/0144681 A1* 5/2014 Pushparaj .......... C03C 17/3671
428/164

FOREIGN PATENT DOCUMENTS

CN      102820268 A  * 12/2012
WO   2021252779 A1    12/2021

OTHER PUBLICATIONS

International Search Report and Written Opinion of PCT/US2021/036836, dated Oct. 7, 2021, titled "Materials and Methods for Passivation of Metal-Plated Through Glass Vias".
(Continued)

*Primary Examiner* — Brook Kebede
(74) *Attorney, Agent, or Firm* — Hamilton, Brook, Smith & Reynolds, P.C.

(57) ABSTRACT

A through-glass via (TGV) formed in a glass substrate may comprise a metal plating layer formed in the TGV. The TGV may have a three-dimensional (3D) topology through the glass substrate and the metal plating layer conformally covering the 3D topology. The TGV may further comprise a barrier layer disposed over the metal plating layer, and a metallization layer disposed over the barrier layer. The metallization layer may be electrically coupled to the metal plating layer through the barrier layer. The barrier layer may comprise a metal-nitride film disposed on the metal plating layer that is electrically coupled to the metallization layer. The barrier layer may comprise a metal film disposed over the metal plating layer and over a portion of glass surrounding the TGV, and an electrically-insulating film disposed upon the metal film, the electrically-insulating film completely overlapping the metal plating layer and partially overlapping the metal film.

18 Claims, 8 Drawing Sheets

(51) Int. Cl.
C23C 16/455 (2006.01)
H01L 23/29 (2006.01)

(58) Field of Classification Search
CPC .. H01L 28/91; C23C 16/402; C23C 16/45525
See application file for complete search history.

(56) References Cited

OTHER PUBLICATIONS

Kumar, et al., "Four Dielectric Substrate Analysis for Millimeter Wave Application," Materials Today: Proceedings, 5, 4, pp. 10771-10778, (2018).
Hung, et al., "Distributed 2- and 3-bit W-band MEMS phase shifters on glass substrates," IEEE Transactions on Microwave Theory and Techniques, 52, 2, pp. 600-606, (2004).
Shorey, et al., "Thin Glass Substrates with Through-Glass Vias: Fabrication and Application to Millimeter Wave Antennas", GOMAC Tech Conference, Mar. 2019.
Bowrothu, R., "Through Glass Via (TGV) Based Band Pass Filter for 5G Communications," in Proceedings of the IEEE 68th Electronic Components and Technology Conference (ECTC), pp. 1097-1102 (2018).
Shorey, et al. "Progress and application of through glass via (TGV) technology," in Proceedings of the Pan Pacific Microelectronics Symposium (Pan Pacific), pp. 285-290, (2016).
Kim, C., et al. "Through-glass interposer integrated high quality RF components," in Proceedings of the IEEE 64th Electronic Components and Technology Conference (ECTC), pp. 1103-1109 (2014).
Shorey, A.B., "Through Glass Via (TGV) Technology for RF Applications," in 48th International Symposium on Microelectronics (IMAPS), pp. 386-389. (2015).
Koester, S.J., "Wafer-level 3D integration technology," IBM Journal of Research and Development, 52, 6, pp. 583-597, (2008).
Shen, W.-W., et al. "Three-Dimensional Integrated Circuit (3D IC) Key Technology: Through-Silicon Via (TSV)," Nanoscale Research Letters, 12, 1, pp. 56:1-56:9, (2017).
Wu, Z., et al. "Design and Demonstration of Ultra-thin Glass 3D IPD Diplexers," in Proceedings of the IEEE 66th Electronic Components and Technology Conference (ECTC), pp. 2348-2352 (2016).
Nikumb, S., "Precision glass machining, drilling and profile cutting by short pulse lasers," Thin Solid Films, 477, 1 -2, pp. 216-221, (2005).
Nguyen, N.T., "Through-wafer copper electroplating for three-dimensional interconnects," Journal of Micromechanics and Microengineering, 12, 4, pp. 395-399, (2002).
Tsau, C.H., "Fabrication of Wafer-Level Thermocompression Bonds," Journal of Microelectromechanical Systems, 11, 6, pp. 641-647, (2002).
Tsau, C.H., "Characterization of Wafer-Level Thermocompression Bonds," Journal of Microelectromechanical Systems, 13, 6, pp. 963-971, (2004).
Nicolet, M.-A., "Diffusion Barriers in Thin Films," Thin Solid Films, 52, 3, pp. 415-443, (1978).
Tompkins, H.G., et al., "Low-temperature diffusion of copper through gold,"Journal of Applied Physics, 47, 9, pp. 3804-3812, (1976).
Tompkins, H.G., et al., "Relative rates of nickel diffusion and copper diffusionthrough gold," Journal of Applied Physics, 48, 7, pp. 3144-3146, (1977).
Pucic, S.P., "Diffusion of copper into gold plating," in Proceedings of the IEEE Instrumentation and Measurement Technology Conference, pp. 114-117 (1993).
Ravi, R., et al., "Diffusion mechanism in the gold-copper system," Journal of Materials Science: Materials in Electronics, 23, 12, pp. 2152-2156, (2012).

* cited by examiner

MATERIALS AND METHODS FOR PASSIVATION OF METAL-PLATED THROUGH GLASS VIAS

BACKGROUND

Glass, for example fused $SiO_2$, is a promising substrate material suitable for high-frequency electrical technologies. These technologies include, for example, millimeter wave devices such as a radio frequency (RF) integrated circuit (IC) and a microelectromechanical system (MEMS). Glass as a substrate material is advantageous because of its unique advantages over conventional substrate materials such as silicon (Si), ceramics, and organic laminates. Glass offers not only superior RF performance (e.g., high electrical isolation, low insertion loss, and low loss tangent at super and extremely high frequencies (SHF and EHF)), but also excellent dimensional and thermal stability (e.g., adjustable coefficient of thermal expansion (CTE), an effective barrier to moisture, and very thin IC and MEMS packages).

For 2.5-dimensional (2.5D) and 3-dimensional (3D) ICs and MEMS, electrical signals may be transmitted through a vertical conductive path referred to as a through-silicon via (TSV), which passes completely through one or more individual substrates and/or an interposer to interconnect multiple IC dies. Such an out-of-plane electrical connection can be achieved in a silicate glass substrate as well, by drilling a through-hole via with a cross-sectional diameter that varies (e.g., 1-100 μm) with respect to depth, thereby forming an hourglass-shaped through-hole through the silicate glass substrate.

The hourglass-shaped hole may be constructed, for example, using a laser machining technique. A cross-sectional view of an example through-glass via (TGV) 102, formed in a silicate glass substrate 104, is shown in FIG. 1A. At the narrowest point 106 of the TGV 102, the diameter may be about 10 μm, although the diameter at this narrowest point 106 may be as small as 1 μm and as large as 100 μm. The TGV outer surface diameter 108 may be about 50 μm, although the outer surface diameter 108 may be as small as 1 μm and as large as 100 μm. The thickness 110 of the silicate glass substrate 104 may be about 300 μm, although the thickness 110 may be as small as 100 μm and as large as 1000 μm.

The inner surface 112 of the TGV 102 may be coated with one or more layers of metal for the formation of a metal-plated or metal-filled TGV, using one or more traditional electroplating techniques known in the art. As shown on the example TGV depicted in FIG. 1B, these metal layers may include a thin adhesion layer 120 (e.g., titanium (Ti)), a metal seed layer 122 disposed on the adhesion layer 120, and a metal plating layer 124 disposed upon the seed layer 122. The metal plating layer 124 may comprise conducting materials such as copper (Cu) or aluminum (Al).

Electrical signals that are routed along horizontal conductive paths (e.g., a patterned metallization layer comprising gold (Au)) may be electrically-coupled to the metal-filled TGVs. During fabrication processes, the metal plating layer 124 of the metal-plated TGV may be exposed to environmental conditions characterized by high levels of oxygen ($O_2$). Some of the atoms of the metal plating layer 124 may diffuse along the grain boundaries of the patterned metallization layer disposed upon the metal plating layer 124 and encounter $O_2$. The $O_2$ can react readily with exposed non-inert metal atoms, for instance, with Cu at temperatures above 100° C., to yield unstable metal-oxide byproducts such as cupric oxide (CuO or $Cu_2O$). The resulting metal-oxide byproducts may degrade the performance, reliability, longevity, and packaging integrity of associated devices. The scanning electron micrographs (SEMs) shown in FIGS. 2A and 2B present such micro-meter and nano-meter scale particles 206, consisting mostly of CuO or $Cu_2O$, produced on the Au surface 204. The particles 206 are produced in regions near the TGV 202 because of the diffusion of Cu atoms through the patterned metallization layer.

To prevent diffusion of atoms of the metal plating layer 124 and the resulting contamination shown in FIGS. 2A and 2B, a barrier layer may be disposed between the metal plating layer 124 and the patterned metallization layer. With the smaller physical dimensions of through-silicon vias (relative to TGVs), deploying such a barrier layer with conventional techniques is feasible. For example, silicon-based fabrication techniques may use a diffusion barrier such as titanium nitride (TiN) or tantalum nitride (TaN), which are deposited using a chemical vapor deposition (CVD) or physical vapor deposition (PVD), or atomic layer deposition (ALD) process. Such TiN or TaN barriers are generally very thin (less than 10 nm), but the thinness is not a problem because the dimensions of the scaled TSV are relatively small (e.g., less than 5 μm in diameter).

Due to the relatively larger dimensions of TGVs, however, a complete deployment of such a barrier using such conventional techniques may present problems. For example, using conventional fabrication techniques (e.g., PVD) to place a barrier film on the 3D topologies associated with the large-dimension hourglass-shaped TGVs described herein may result in an incomplete barrier seal. Such an incomplete seal could allow diffusion of atoms from the metal plating layer to the patterned metallization layer.

SUMMARY

The embodiments described herein are directed to a passivation (or barrier) layer, and methods of fabrication thereof, associated with a metallized through-glass via (TGV). Ideally, an intervening layer disposed between the metal plating layer of the TGV and the outer metallization layer may operate as a barrier to migration of atoms of the metal plating layer to the outer metallization layer. For example, the intervening layer 302 between the metal plating layer 124 and the outer metallization layer 304 depicted in FIG. 3 may operate to prevent atoms from the metal plating layer from diffusing to the outer metallization layer 304. The 3D topology and the large spatial dimensions (relative to a TSV) of the hourglass-shaped TGV create impediments to establishing a complete barrier layer within the TGV. Thin film deposition techniques known in the art (e.g., PVD) generally create conformal films, but such thin conformal film deposition techniques may result in incomplete filling of 3D typologies such as the large-dimension hourglass-shaped TGV shown in FIG. 1A, FIG. 1B, and FIG. 3. Any region of the 3D topology that is not covered by the barrier film may provide a path for metal diffusion.

According to the described embodiments, oxide-based and nitride-based thin films, such as silicon dioxide ($SiO_2$) and titanium nitride (TiN), may effectively serve as a diffusion barrier layer to block metal diffusion and subsequent $O_2$ interaction. Such barriers can be deposited on the surface of metallized TGV substrates with conventional deposition techniques such as CVD, PVD, and ALD, and patterned with standard photolithography and etching processes.

In one aspect, the invention may be a method of disposing a barrier film on a metallized through-glass via (TGV) formed in a glass substrate, comprising using an atomic layer deposition (ALD) procedure to establish a metal-nitride film on a metal plating layer of the metallized TGV, and forming an electrically-conductive metallization layer upon the metal-nitride film. The electrically-conductive metallization layer may be electrically-coupled to the metal-nitride film.

The method may further comprise formulating the conductive metal-nitride film to comprise titanium nitride (TiN). The method may further comprise electrically coupling the outer metallization layer to the conductive metal-nitride film. The method may further comprise depositing one or more conductive coatings on the conductive metal-nitride film. The one or more conductive coatings comprise one or both of TiW and Au.

In another aspect, the invention may be a method of disposing a barrier film on a metallized through-glass via (TGV) formed in a glass substrate, comprising using a physical vapor deposition (PVD) procedure to establish a metal film (i) over a metal plating layer of the metallized TGV and (ii) over at least portions of glass surrounding the TGV. The method may further comprise using a chemical vapor deposition (CVD) procedure to establish an electrically-insulating film upon the metal film. The electrically-insulating film may completely overlap the metal plating layer and partially overlap the metal film. The method may further comprise using a PVD procedure to form an electrically-conductive metallization layer over the insulating film and over the metal film. The electrically-conductive metallization layer may be electrically-coupled to the metal film.

The method may further comprise preparing the conductive metal film to include titanium tungsten (TiW). The method may further comprise preparing the insulating film to include silicon dioxide ($SiO_2$). The method may further comprise patterning the insulating film to form a diffusion barrier patch that covers at least a region of the conductive metal film that overlays the TGV. The method may further comprise extending the insulating film so that the diffusion barrier patch covers at least a portion of the glass surrounding the TGV.

The method may further comprise electrically coupling the outer metallization layer to the conductive metal film. The method may further comprise depositing one or more conductive coatings on the conductive metal-nitride film. The one or more conductive coatings comprise one or both of TiW and Au.

In another aspect, the invention may be a through-glass via (TGV) formed in a glass substrate, comprising a metal plating layer formed in the TGV. The TGV may have a three-dimensional (3D) topology through the glass substrate and the metal plating layer conformally covering the 3D topology. The TGV may further comprise a barrier layer disposed over the metal plating layer, and an electrically-conductive metallization layer disposed over the barrier layer. The electrically-conductive metallization layer may be electrically-coupled to the metal plating layer through the barrier layer.

The barrier layer may further comprise a metal-nitride film disposed on the metal plating layer, the metal-nitride layer being electrically coupled to the electrically-conductive metallization layer. The metal-nitride film may be titanium nitride (TiN).

The barrier layer may further comprise (i) a metal film disposed over the metal plating layer and over at least a portion of glass surrounding the TGV, and (ii) an electrically-insulating film disposed upon the metal film. The electrically-insulating film may completely overlap the metal plating layer and partially overlap the metal film. The metal film may be electrically-coupled to the electrically-conductive metallization layer. The metal film may be titanium tungsten (TiW), and the electrically-insulating film may be silicon dioxide ($SiO_2$). The TGV may further comprise one or more conductive coatings on the electrically-conductive metallization layer. The one or more conductive coatings may comprise one or both of TiW and Au.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

Figure 1A:
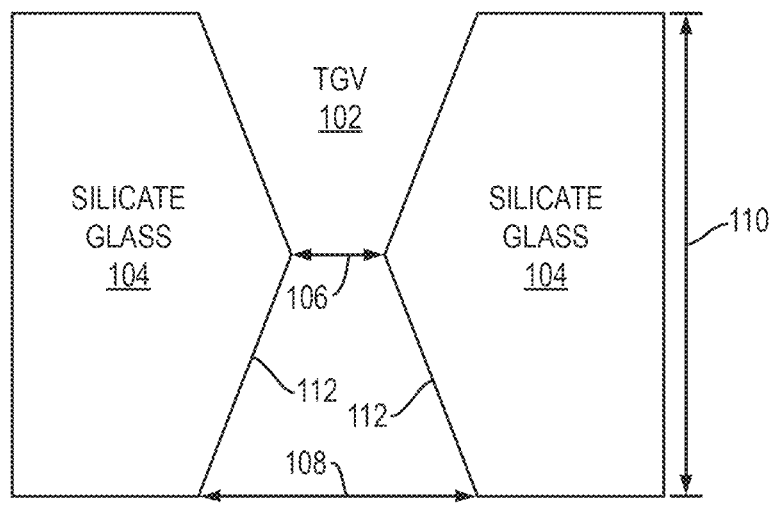
FIG. 1A shows a cross-sectional view of an example through-glass via (TGV), formed in a silicate glass substrate.
Figure 1B:
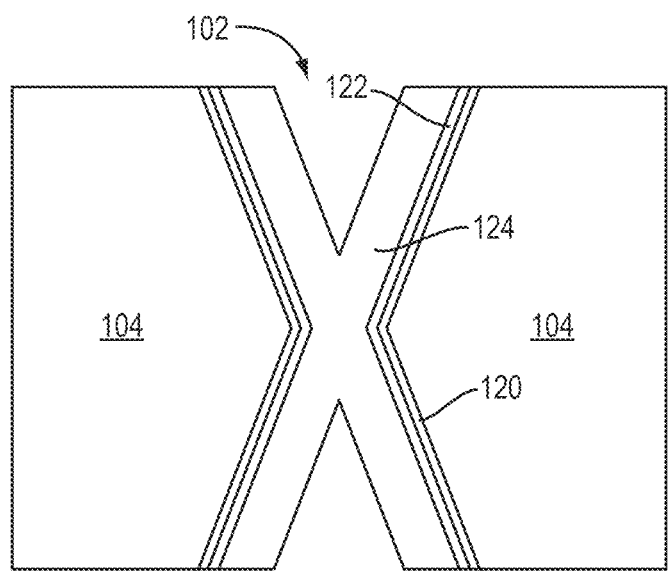
FIG. 1B shows the TGV of FIG. 1A with thin adhesion layer, a metal seed layer disposed on the adhesion layer, and a metal plating layer disposed upon the seed layer.
Figure 3:
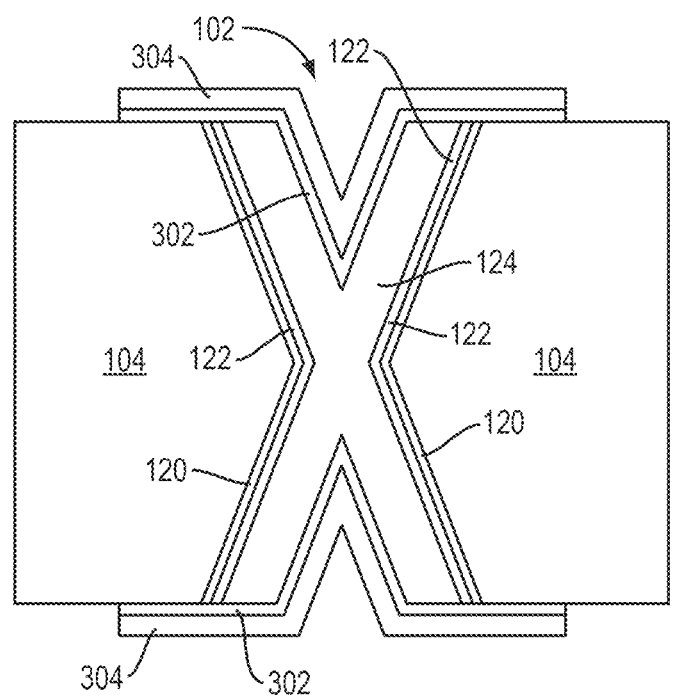
FIG. 3 shows an example TGV with metal films deposited on the top and/or bottom surfaces of the glass substrate.

The embodiments described herein are directed to a passivation (or barrier) layer associated with a metallized through-glass via (TGV). As described herein, FIG. 1B illustrates an example hourglass-shaped TGV lined with an adhesion layer 120, a metal seed layer 122, and a metal plating layer 124. This example TGV is shown in FIG. 3 with one or more metal films deposited on the top and/or bottom surfaces of the glass substrate, using, for example, a physical vapor deposition (PVD) technique. For the example illustrated in FIG. 3, a first metal layer 302 of titanium tungsten (TiW) is deposited on the metal plating layer 124, and a second metal layer 304 of gold (Au) is disposed on the first metal layer 302. The outer metallization layer 304 may serve not only as a conductive path for die-to-die interconnects, but also as bond pads or seal rings when joining device and lid substrates using a wafer bonding technique, e.g., through thermos-compressive bonding. For thermo-compressive bonding with the Au seal rings of a counter substrate, clean Au bond pads that are free of foreign particles are needed for strong Au-to-Au bonds to achieve a hermetic seal. Appropriate surface passivation for metal-filled TGVs may reduce or prevent metal diffusion and interaction with $O_2$ and hence prevent unwanted metal-oxide particle formation.

The described embodiments allow for a significant reduction in parasitic metal-oxides created on the substrate. Specifically, the surface of a silicate glass wafer, which has metal-filled TGVs, is coated with a passivation layer. Further, the described embodiments facilitate disposing the passivation layer on the non-planar, 3-dimensional (3D) topographies of the types of TGVs described herein. In certain applications, the TGV is required to convey a significant amount of electrical power, and is necessarily physically larger than typical TGVs. The described embodiments facilitate complete coverage of the TGV, to prevent potential diffusion paths.

Figure 4:
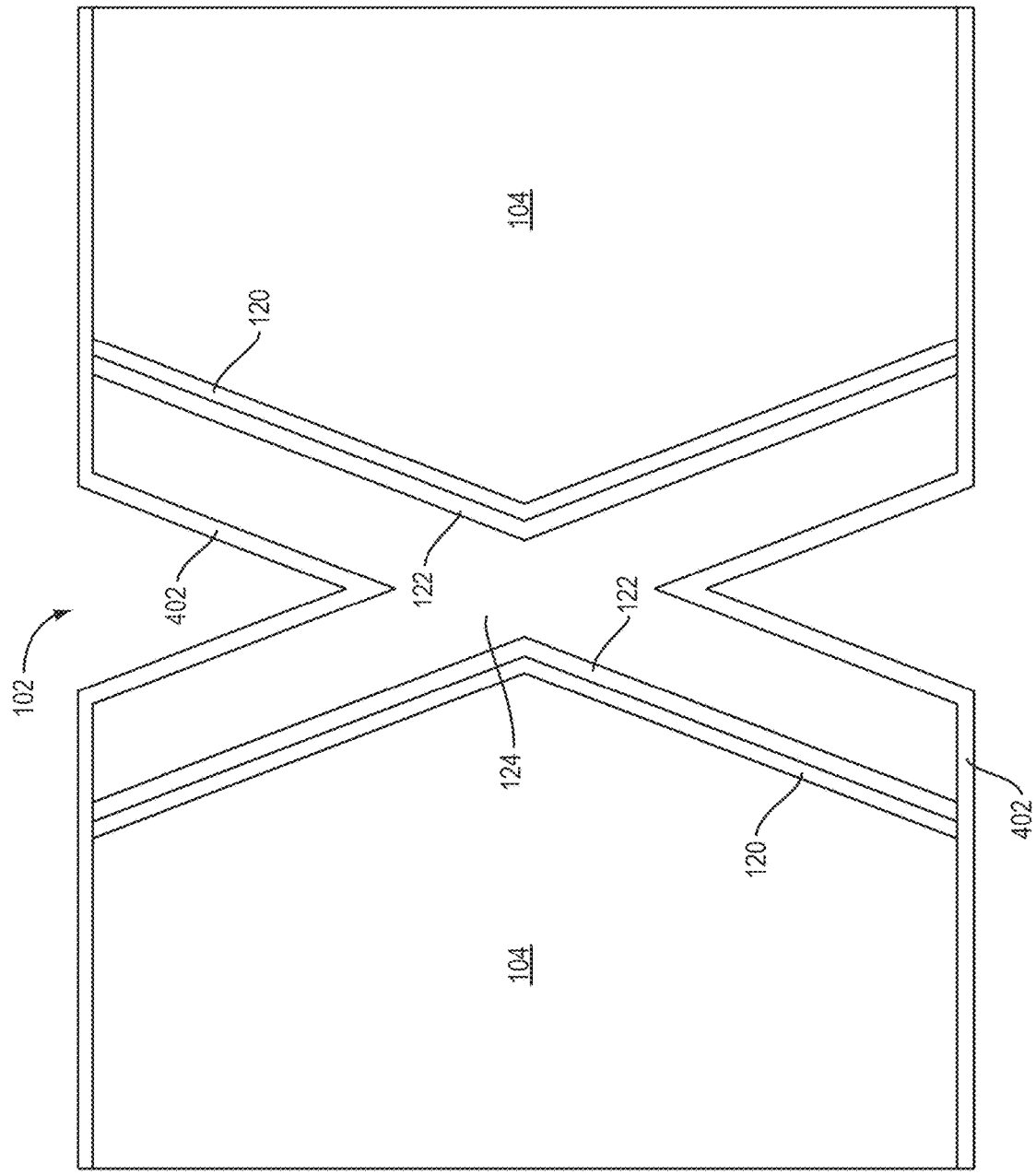
FIG. 4 shows one embodiment of passivation layer deployed on a TGV according to the invention.

In one embodiment, shown in FIG. 4, the passivation layer comprises a conductive metal-nitride film 402, deposited using an atomic layer deposition (ALD) method known in the art. In the example embodiment, the metal-nitride film 402 comprises titanium nitride (TiN), although in other embodiments other metal-nitride materials, e.g, tantalum nitride (TaN) may alternatively be used. The ALD processing facilitates complete conformal deposition of the metal-nitride film 402 within the 3D topography of the TGV.

Figure 5:
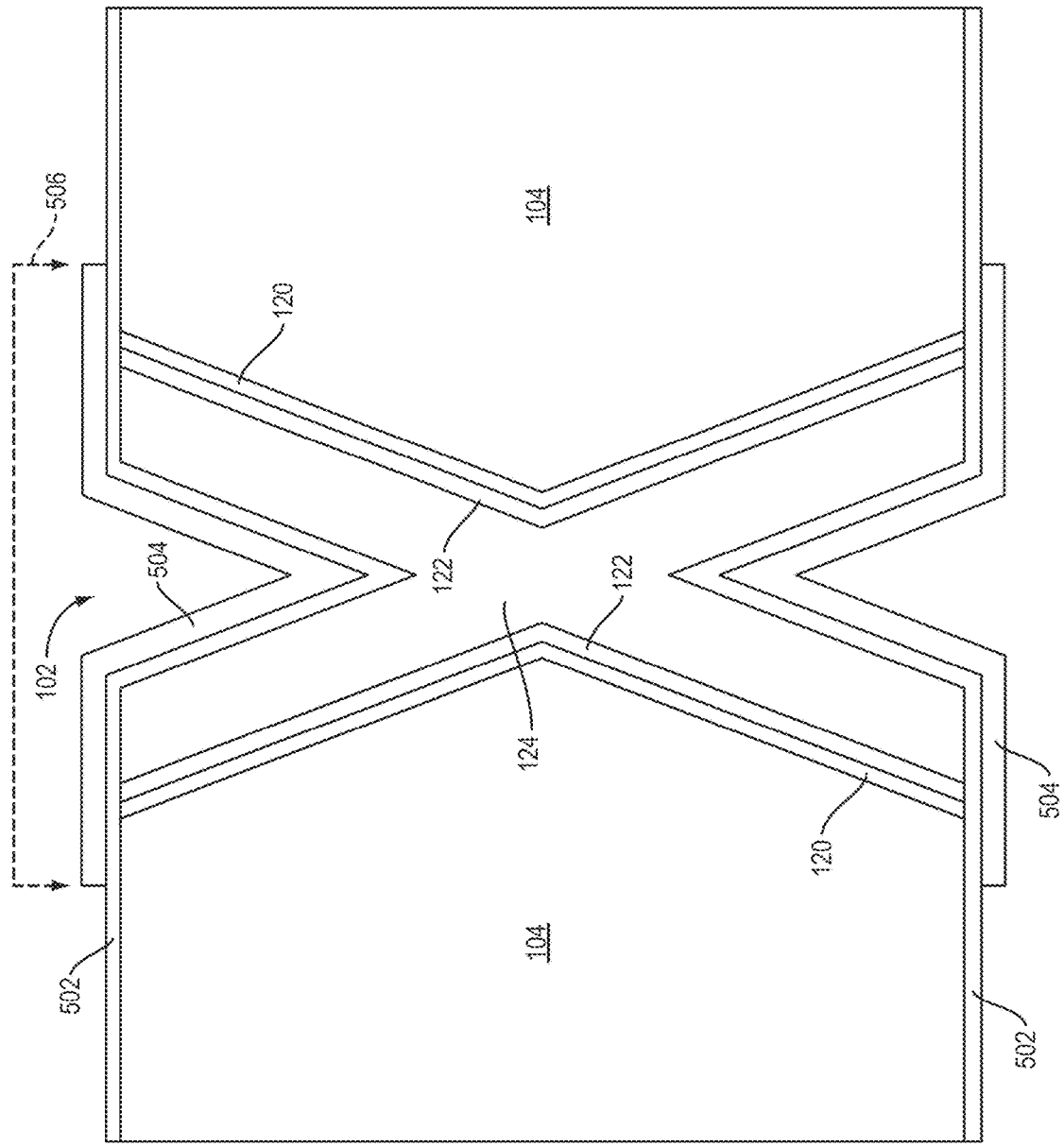
FIG. 5 shows another embodiment of passivation layer deployed on a TGV according to the invention.

In another embodiment, the passivation layer may comprise two parallel layers comprising an insulating oxide-based film 504, deposited by chemical vapor deposition (CVD) on the surface of a metal film 502, e.g., titanium tungsten (TiW), which is deposited by PVD on the metal plating layer 124, as shown in FIG. 5. In the example embodiment described herein, the insulating oxide-based film 504 comprises silicon dioxide ($SiO_2$), although other insulating oxide-based materials known in the art, e.g., amorphous aluminum oxide ($Al_2O_3$) may alternatively be used. In the example embodiment described herein, the metal film 502 comprises titanium tungsten (TiW), although in alternative embodiments the metal film 502 may comprise other transition metals such as titanium (Ti) and chromium (Cr) deposited by PVD, or transition metal alloys such as TiN and TaN deposited by PVD.

The insulating oxide-based film 504 may be patterned to form a diffusion barrier patch 506 over a metal-filled TGV (i.e., the metal plating layer 124), thereby exposing the underlying metal film 502 outside of the diffusion barrier patch, as shown in FIG. 5. This oxide patch can effectively serve as a barrier that hampers metal-$O_2$ diffusion and reaction.

Figure 2A:
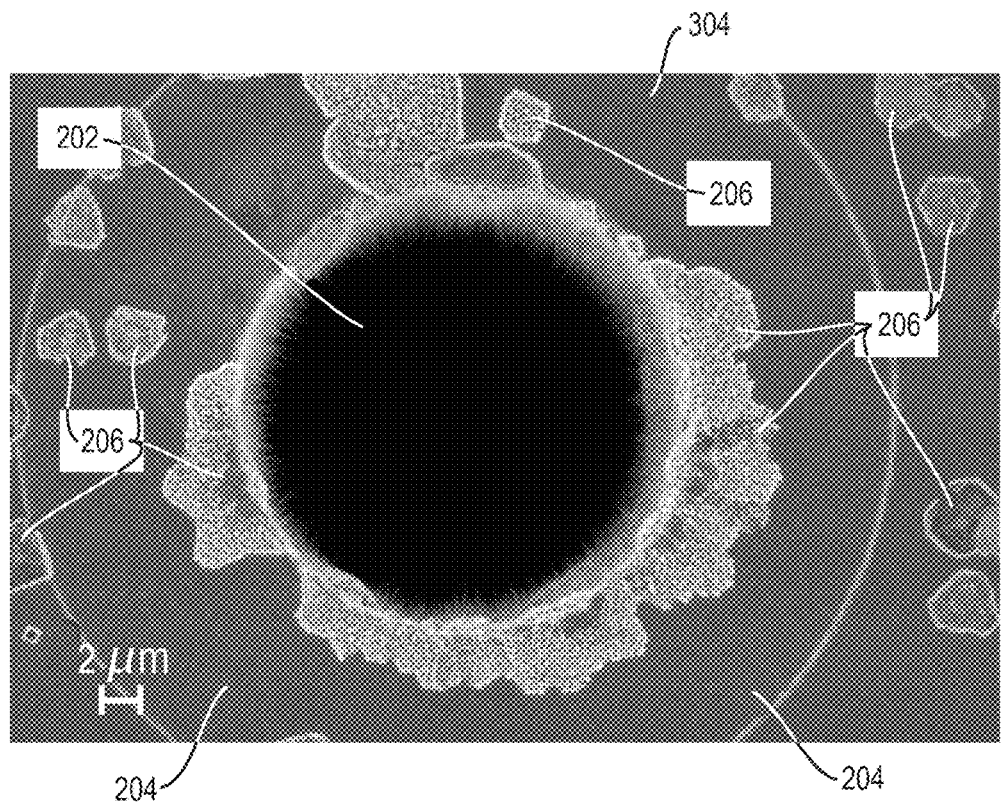
FIGS. 2A and 2B show scanning electron micrographs (SEMs) that depict micro-meter and nano-meter scale particles on the Au surface of a TGV.
Figure 2B:
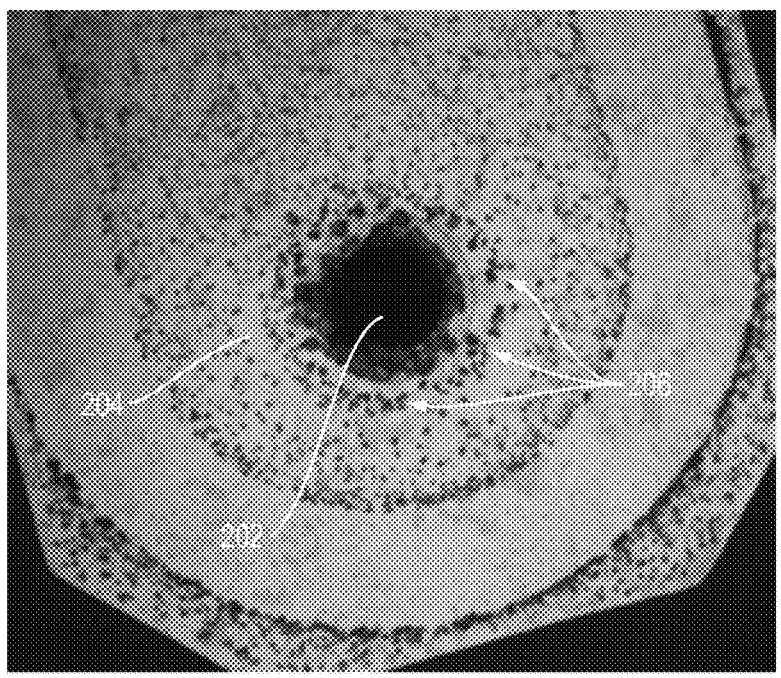
Figure 6B:
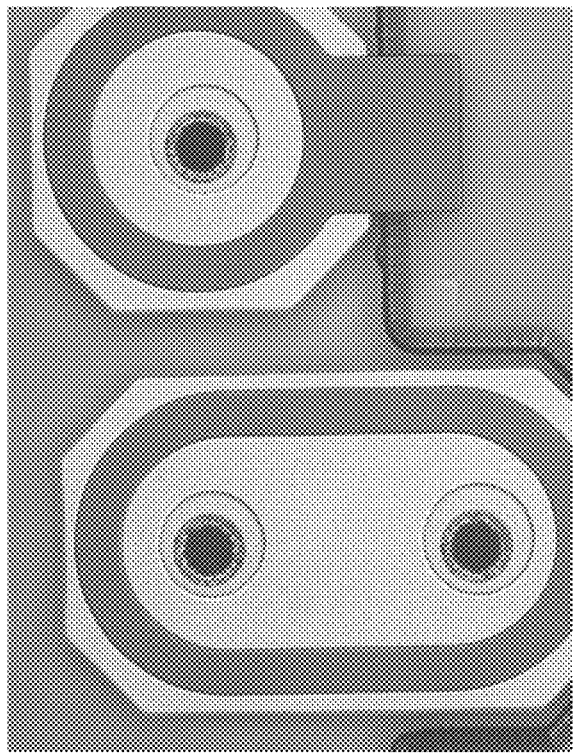
FIGS. 6A and 6B show examples of TGVs fabricated with a passivation layer according to the invention.
Figure 6A:
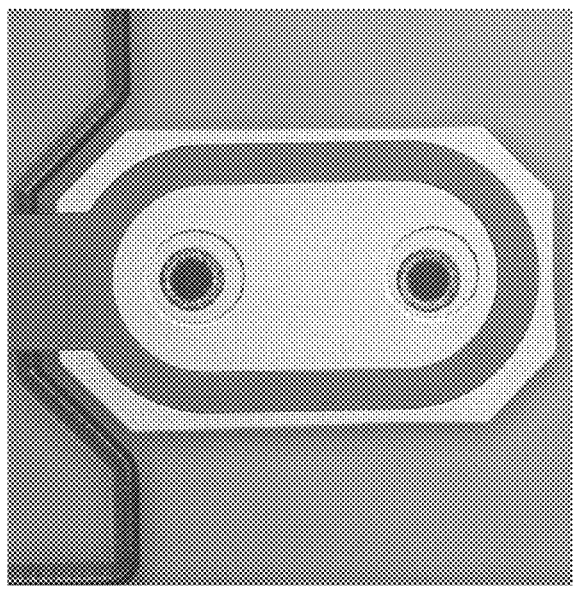

Optical micrographs shown in FIGS. 6A and 6B demonstrate that metal-oxide particles are substantially obsolete in the presence of a $SiO_2$/TiW diffusion barrier patch 506, whereas those in FIGS. 2A and 2B show that cupric oxide particles are prevalent on the Au surface in the absence of a passivation layer.

Figure 7:
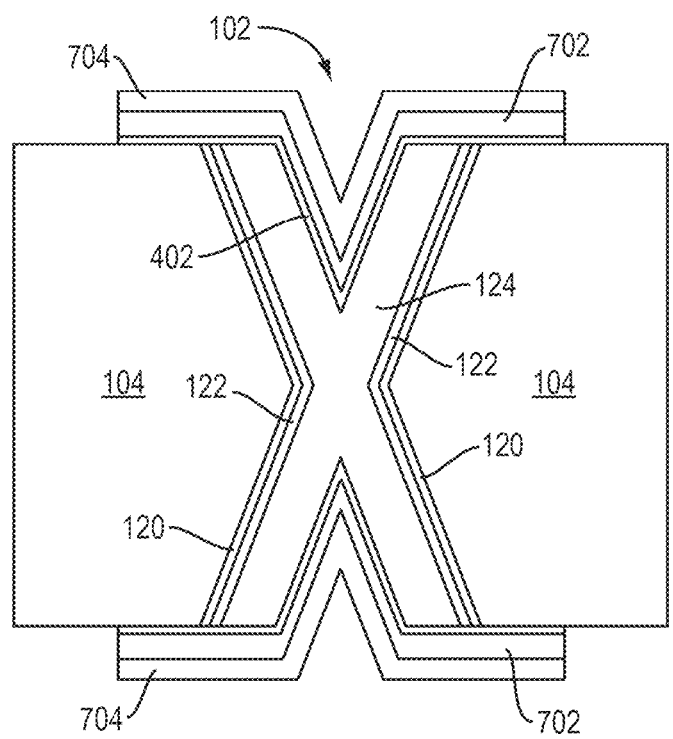
FIG. 7 shows an embodiment of the passivated TGV of FIG. 4 with additional metal coatings for use as conductive interconnect paths and/or seal rings for use in IC and MEMS packaging.
Figure 8:
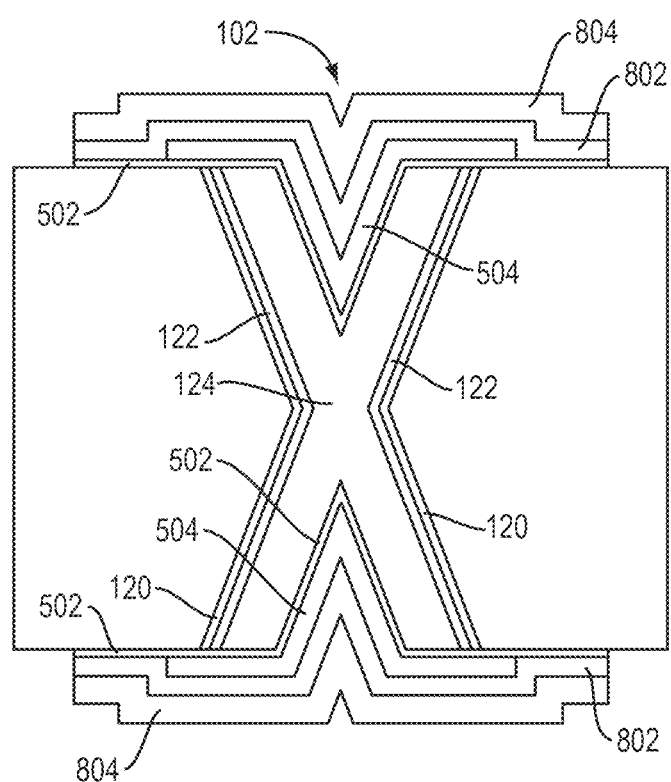
FIG. 8 shows an embodiment of the passivated TGV of FIG. 5 with additional metal coatings for use as conductive interconnect paths and/or seal rings for use in IC and MEMS packaging.

One or more extra metal coatings, e.g., Au and TiW, can be applied atop the passivation layer implemented by either of the techniques described with respect to FIGS. 4 and 5. The additional metal coatings may be deposited by PVD and then patterned by standard photolithography and etching techniques together with the passivation layer. In the example embodiment shown in FIG. 7, which corresponds to the embodiment depicted in FIG. 4, the additional metal coatings over the underlying TiN film 402 comprise a TiW film 702 and an Au film 704. In the example embodiment shown in FIG. 8, which corresponds to the embodiment depicted in FIG. 5, the additional metal coatings over the underlying TiW film 502 outside of the $SiO_2$/TiW diffusion barrier patch 506 likewise comprise a TiW film 802 and an Au film 804. The additional metal coatings 702, 704, 802, 804 may be used to define conductive paths for die-to-die interconnects and bond pads, and/or seal rings for use in IC and MEMS packaging.

In the described embodiments, metal-nitride and oxide-based thin films, such as TiN and $SiO_2$, have been proposed to passivate the surface of metal-filled TGVs. The metal-nitride and oxide-based thin films may function as an effective diffusion barrier, and may inhibit non-inert metal atoms within a metal plating layer from diffusing through a metallization layer and hence encountering and reacting with $O_2$, enabling the fabrication of clean silicate glass substrate surfaces free of undesirable metal-oxide micro- and nano-particles. The metal-nitride and oxide-based thin films can be deposited easily with conventional deposition methods such as CVD, PVD, and ALD onto the surface of metallized TGV wafers and patterned easily with standard photolithography and etching techniques.

The described embodiments demonstrate great potential for applications in 3, 2.5, and 2-dimensional (3D, 2.5D, and 2D, respectively) ICs and MEMS that require silicate glass packaging for excellent electrical isolation, RF performance, optical transparency, and structural flexibility.

While example embodiments have been particularly shown and described, it will be understood by those skilled in the art that various changes in form and details may be made therein without departing from the scope of the embodiments encompassed by the appended claims.

What is claimed is:

1. A method of disposing a barrier film on a metallized through-glass via (TGV) formed in a glass substrate, comprising:
   using an atomic layer deposition (ALD) procedure to establish a metal-nitride film disposed on a metal plating layer of the metallized TGV;
   forming an electrically-conductive metallization layer upon the metal-nitride film, the electrically-conductive metallization layer being electrically coupled to the metal-nitride film; and
   depositing one or more conductive coatings, each of which comprises one or both of TiW and Au, on the conductive metal-nitride film.

2. The method of claim 1, further comprising formulating the conductive metal-nitride film to comprise titanium nitride (TiN).

3. The method of claim 1, further comprising electrically coupling the outer metallization layer to the conductive metal-nitride film.

4. A method of disposing a barrier film on a metallized through-glass via (TGV) formed in a glass substrate, comprising:
   using a physical vapor deposition (PVD) procedure to establish a metal film (i) over a metal plating layer of the metallized TGV and (ii) over at least portions of glass surrounding the TGV;
   using a chemical vapor deposition (CVD) procedure to establish an electrically-insulating film upon the metal film, the electrically-insulating film completely overlapping the metal plating layer and partially overlapping the metal film; and
   using a PVD procedure to form an electrically-conductive metallization layer over the insulating film and over the metal film, the electrically-conductive metallization layer being electrically coupled to the metal film.

5. The method of claim 4, further comprising preparing the conductive metal film to include titanium tungsten (TiW).

6. The method of claim 4, further comprising preparing the insulating film to include silicon dioxide (SiO2).

7. The method of claim 4, further comprising patterning the insulating film to form a diffusion barrier patch that covers at least a region of the conductive metal film that overlays the TGV.

8. The method of claim 7, further comprising extending the insulating film so that the diffusion barrier patch covers at least a portion of the glass surrounding the TGV.

9. The method of claim 4, further comprising electrically coupling the outer metallization layer to the conductive metal film.

10. The method of claim 4, further comprising depositing one or more conductive coatings on the conductive metal-nitride film.

11. The method of claim 10, wherein the one or more conductive coatings comprise one or both of TiW and Au.

12. A through-glass via (TGV) formed in a glass substrate, comprising:
a metal plating layer formed in the TGV, the TGV having a three-dimensional (3D) topology through the glass substrate and the metal plating layer conformally covering the 3D topology;
a barrier layer disposed over the metal plating layer; and
an electrically-conductive metallization layer disposed over the barrier layer, the electrically-conductive metallization layer being electrically coupled to the metal plating layer through the barrier layer.

13. The TGV of claim 12, wherein the barrier layer further comprises a metal-nitride film disposed on the metal plating layer, the metal-nitride layer being electrically coupled to the electrically-conductive metallization layer.

14. The TGV of claim 13, wherein the metal-nitride film is titanium nitride (TiN).

15. The TGV of claim 12, wherein the barrier layer further comprises (i) a metal film disposed over the metal plating layer and over at least a portion of glass surrounding the TGV, and (ii) an electrically-insulating film disposed upon the metal film, the electrically-insulating film completely overlapping the metal plating layer and partially overlapping the metal film, and wherein the metal film being electrically coupled to the electrically-conductive metallization layer.

16. The TGV of claim 15, wherein the metal film is titanium tungsten (TiW), and the electrically-insulating film is silicon dioxide (SiO2).

17. The TGV of claim 12, further comprising one or more conductive coatings on the electrically-conductive metallization layer.

18. The TGV of claim 17, wherein the one or more conductive coatings comprise one or both of TiW and Au.

* * * * *